(12) United States Patent
Strachan et al.

(10) Patent No.: US 10,332,592 B2
(45) Date of Patent: Jun. 25, 2019

(54) HARDWARE ACCELERATORS FOR CALCULATING NODE VALUES OF NEURAL NETWORKS

(71) Applicant: Hewlett Packard Enterprise Development LP, Houston, TX (US)

(72) Inventors: John Paul Strachan, San Carlos, CA (US); Brent Buchanan, Fort Collins, CO (US); Le Zheng, Palo Alto, CA (US)

(73) Assignee: HEWLETT PACKARD ENTERPRISE DEVELOPMENT LP, Houston, TX (US)

( * ) Notice: Subject to any disclaimer, the term of this patent is extended or adjusted under 35 U.S.C. 154(b) by 0 days.

(21) Appl. No.: 15/570,951

(22) PCT Filed: Mar. 11, 2016

(86) PCT No.: PCT/US2016/022052
§ 371 (c)(1),
(2) Date: Oct. 31, 2017

(87) PCT Pub. No.: WO2017/155544
PCT Pub. Date: Sep. 14, 2017

(65) Prior Publication Data
US 2018/0114569 A1    Apr. 26, 2018

(51) Int. Cl.
*G11C 11/54* (2006.01)
*G06F 9/06* (2006.01)
*G06N 3/063* (2006.01)
*G11C 13/00* (2006.01)
(Continued)

(52) U.S. Cl.
CPC .......... *G11C 11/54* (2013.01); *G06F 9/06* (2013.01); *G06N 3/0635* (2013.01);
(Continued)

(58) Field of Classification Search
CPC ..... G11C 11/54; G11C 7/1006; G11C 7/1012; G11C 13/0069; G11C 13/0007; G06F 9/06; G06N 3/0635; G06N 3/0454
(Continued)

(56) References Cited

U.S. PATENT DOCUMENTS 5,555,439 A * 9/1996 Higashino .............. G06N 3/084
706/20
9,152,827 B2  10/2015 Linderman et al.
(Continued)

FOREIGN PATENT DOCUMENTS

EP     2230633       9/2010
JP     2010049776    3/2010
WO     WO-2015195365 12/2015

OTHER PUBLICATIONS

EPO, Extended Search Report, dated Mar. 14, 2018, Application No. 16893765.4, 9 pages.
(Continued)

*Primary Examiner* — Fernando Hidalgo
(74) *Attorney, Agent, or Firm* — Hewlett Packard Enterprise Patent Department

(57) ABSTRACT

Examples herein relate to hardware accelerators for calculating node values of neural networks. An example hardware accelerator may include a crossbar array programmed to calculate node values of a neural network and a current comparator to compare an output current from the crossbar array to a threshold current according to an update rule to generate new node values. The crossbar array has a plurality of row lines, a plurality of column lines, and a memory cell coupled between each unique combination of one row line and one column line, where the memory cells are programmed according to a weight matrix. The plurality of row lines are to receive an input vector of node values, and the
(Continued)

plurality of column lines are to deliver an output current to be compared with the threshold current.

13 Claims, 5 Drawing Sheets

(51) Int. Cl.
    *G11C 7/10*     (2006.01)
    *G06N 3/04*     (2006.01)

(52) U.S. Cl.
    CPC .......... *G11C 7/1006* (2013.01); *G11C 7/1012* (2013.01); *G11C 13/0069* (2013.01); *G06N 3/0454* (2013.01); *G11C 13/0007* (2013.01)

(58) Field of Classification Search
    USPC .......................................................... 706/15
    See application file for complete search history.

(56) References Cited

U.S. PATENT DOCUMENTS

| | | |
|---|---|---|
| 2009/0163826 A1 | 6/2009 | Mouttet |
| 2013/0336036 A1 | 12/2013 | Cernea |
| 2015/0347896 A1* | 12/2015 | Roy ........................ G11C 11/16 365/148 |
| 2016/0035432 A1 | 2/2016 | Park |

OTHER PUBLICATIONS

Fan Deliang, "Design and Synthesis 1-15 of Ultralow Energy Spin-Memristor Threshold Logic", IEEE Transactions on Nanotechnology, May 1, 2014, pp. 574-583.

Hu, S.G. et al., "Associative Memory Realized By A Reconfigurable Memristive Hopfield Neural Network", < http://www.nature.com/ncomms/2015/150625/ncomms8522/pdf/ncomms8522.pdf > (Research Paper), Jun. 25, 2015, 8 pages.

Liu, B., "Memristor-Based Analog Neuromorphic Computing Engine Design And Robust Training Scheme", <http://d-scholarship.pitt.edu/20918/1/Liu_etd2014.pdf > (Research Paper), 2011, 49 pages.

Prezioso, M. et al., "Training and Operation Of An Integrated Neuromorphic Network Based On Metal-Oxide Memristors," < http://arxiv.org/ftp/arxiv/papers/1412/1412.0611.pdf > (Research Paper), Dec. 2014, 21 pages.

Zhu, S. et al., "Memristor-Based Neural Network PID Controller For Buck Converter", < http://ieeexplore.ieee.org/stamp/stamp.jsp?arnumber=7388140 > (Research Paper), Nov. 26-28, 2015, 6 pages.

* cited by examiner

HARDWARE ACCELERATORS FOR CALCULATING NODE VALUES OF NEURAL NETWORKS

STATEMENT OF GOVERNMENT INTEREST

This invention was made with Government support. The government has certain rights in the invention.

BACKGROUND

Memristors are devices that can be programmed to different resistive states by applying a programming energy, such as a voltage. Large crossbar arrays of memory devices with memristors can be used in a variety of applications, including memory, programmable logic, signal processing control systems, pattern recognition, and other applications.

Neural networks are a family of technical models inspired by biological nervous systems and are used to estimate or approximate functions that depend on a large number of inputs. Neural networks may be represented as systems of interconnected "neurons" which exchange messages between each other. The connections may have numeric weights that can be tuned based on experience, making neural networks adaptive to inputs and capable of machine learning.

BRIEF DESCRIPTION OF THE DRAWINGS

The following detailed description references the drawings, wherein.

DETAILED DESCRIPTION

Figure 1:
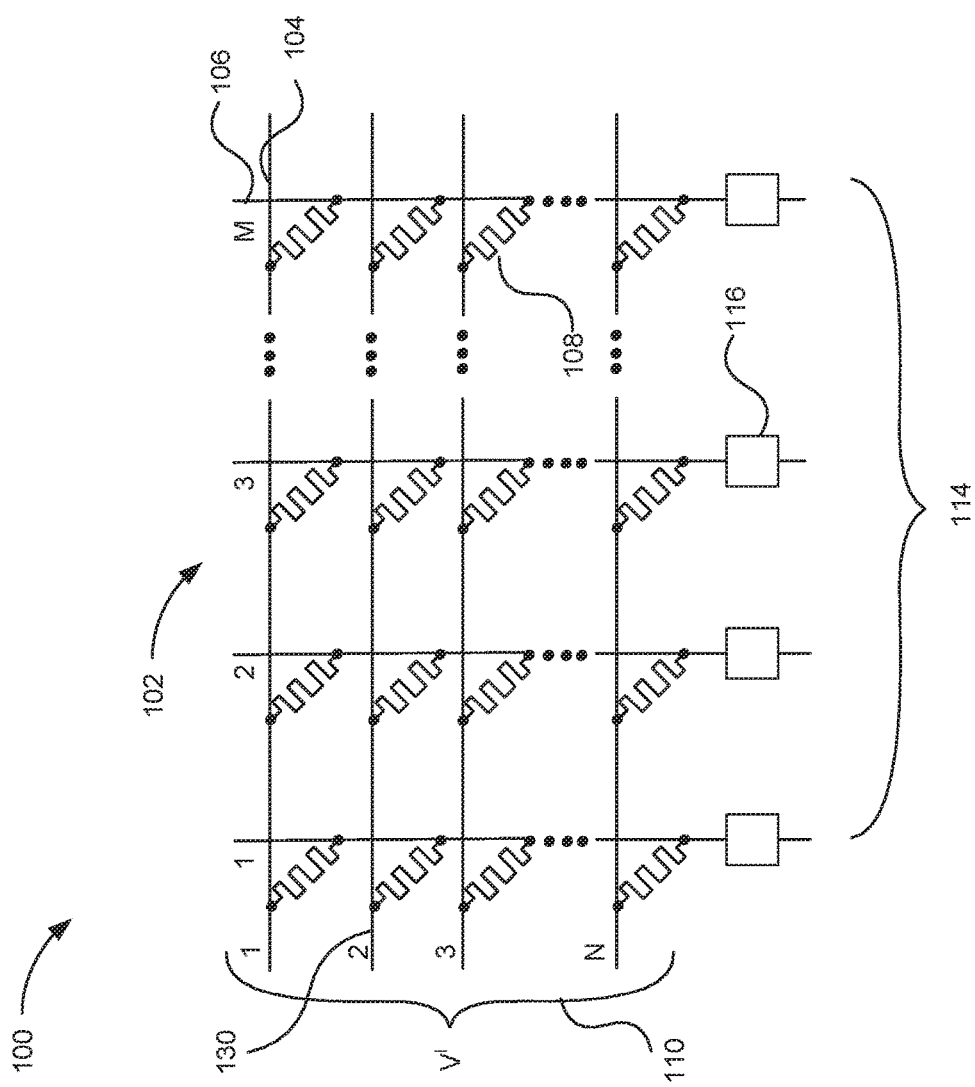
FIG. 1 is a diagram of an example hardware accelerator for calculating node values of neural networks.

Artificial neural networks (herein commonly referred simply as "neural network") are a family of technical models inspired by biological nervous systems and are used to estimate or approximate functions that depend on a large number of inputs. Neural networks may be represented as systems of interconnected "neurons" which exchange messages between each other. The connections may have numeric weights that can be tuned based on experience, making neural networks adaptive to inputs and capable of machine learning. Neural networks may have a variety of applications, including function approximation, classification, data processing, robotics, and computer numerical control. However, implementing an artificial neural network may be very computation-intensive, and may be too resource-hungry to be optimally realized with a general processor.

Memristors are devices that may be used as components in a wide range of electronic circuits, such as memories, switches, radio frequency circuits, and logic circuits and systems. In a memory structure, a crossbar array of memory devices having memristors may be used. When used as a basis for memory devices, memristors may be used to store bits of information, 1 or 0. The resistance of a memristor may be changed by applying an electrical stimulus, such as a voltage or a current, through the memristor. Generally, at least one channel may be formed that is capable of being switched between two states-one in which the channel forms an electrically conductive path ("on") and one in which the channel forms a less conductive path ("off"). In some other cases, conductive paths represent "off" and less conductive paths represent "on". Furthermore, memristors may also behave as an analog component with variable conductance.

In some applications, a memory crossbar array can be used to perform vector-matrix computations. For example, an input voltage signal from each row line of the crossbar is weighted by the conductance of the resistive devices in each column line and accumulated as the current output from each column line. Ideally, if wire resistances can be ignored, the current, I, flowing out of the crossbar array will be approximately $I^T=V^T G$, where V is the input voltage and G is the conductance matrix, including contributions from each memristor in the crossbar array. The use of memristors at junctions or cross-point of the crossbar array enables programming the resistance (or conductance) at each such junction.

Examples disclosed herein provide for hardware accelerators for calculating node values for neural networks. Example hardware accelerators may include a crossbar array programmed to calculate node values. Memory cells of the crossbar array may be programmed according to a weight matrix. Driving input voltages mapped from an input vector through the crossbar array may produce output current values which may be compared to a threshold current to generate a new input vector of new node values. In this manner, example accelerators herein provide for hardware calculations of node values for neural networks.

Referring now to the drawings, FIG. 1 illustrates an example hardware accelerator 100. Hardware accelerator 100 may be a hardware unit that executes an operation that calculates node values for neural networks. Hardware accelerator 100 may calculate new node values of a neural network by transforming an input vector in relation to a weight matrix. Hardware accelerator 100 may do so by calculating a vector-matrix multiplication of the input vector with the weight matrix.

A neural network may be a technological implementation of models inspired by biological nervous systems and may be used to estimate or approximate functions that depend on a large number of inputs. Neural networks may be represented as systems of interconnected "neurons" which exchange messages between each other. The connections may have numeric weights that can be tuned based on experience, making neural networks adaptive to inputs and capable of machine learning. There may be various types of neural networks, including feedforward neural networks, radial basis function neural networks, recurrent neural networks, and other types. A neural network, such as a recurrent neural network like a Hopfield network, may be implemented as a hardware accelerator as described herein. Neural networks, such as a Hopfield network, may provide computational capabilities for logic, optimization, analog-digital conversion, encoding and decoding, and associative memories.

Figure 5:
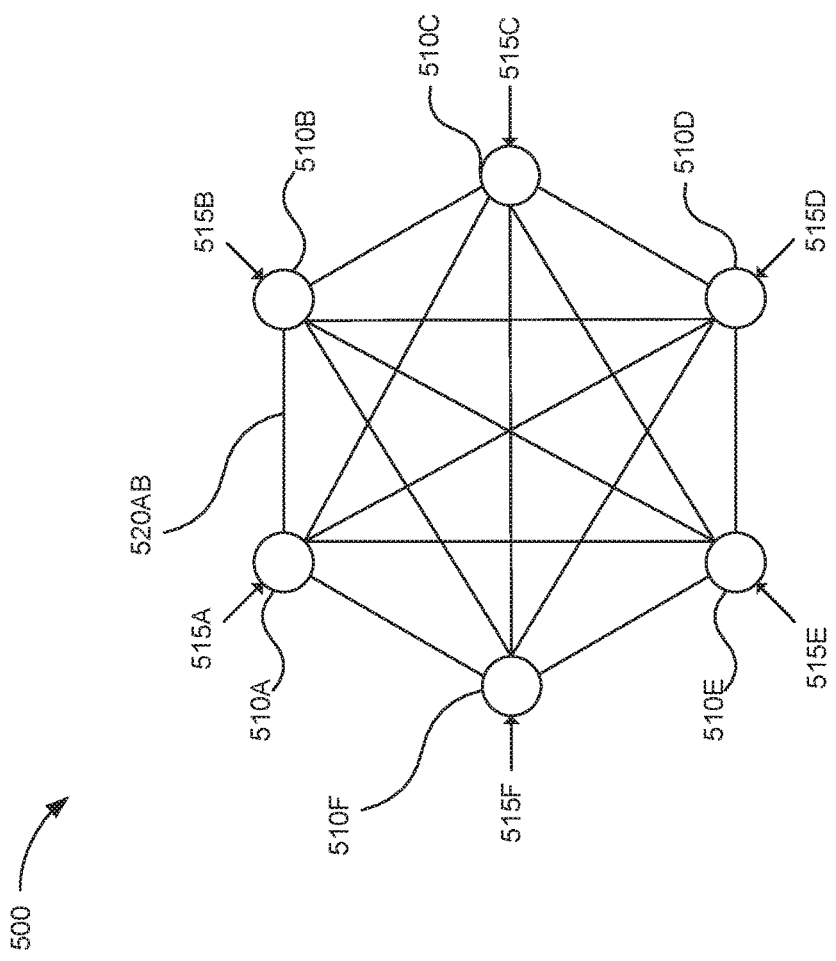
FIG. 5 is a conceptual model of an example neural network.

A model of a neural network is conceptually illustrated in FIG. 5. A neural network 500 may have a plurality of nodes 510A-510F and edges 520. Edges are formed between each node 510, but for simply only the edge 520AB between 510A and 510B is illustrated. A computational problem may be encoded in the weights of the edges and which may contain a threshold function. Input node values 515A-515F may be delivered to the nodes until the computational answer of the problem may be determined by a final state of the node values. In this manner, the neural network 500 may be a dynamical system, and the node values may evolve based on the edge weights to the other node values, which may be represented as a dot-product operation.

Referring back to FIG. 1, hardware accelerator 100 may be implemented as a crossbar array 102 and current comparators 116. Crossbar array 102 may be a configuration of parallel and perpendicular lines with memory cells coupled between lines at intersections. Crossbar array 102 may include a plurality of row lines 104, a plurality of column lines 106, and a plurality of memory cells 108. A memory cell 108 may be coupled between each unique combination of one row line 104 and one column line 106. In otherwords, no memory cell 108 shares both a row line and a column line.

Row lines 104 may be electrodes that carry current through crossbar array 100. In some examples, row lines 104 may be parallel to each other, generally with equal spacing. Row lines 104 may sometimes be, for example, a top electrode or a word line. Similarly, column lines 106 may be electrodes that run nonparallel to row lines 104. Column lines 106 may sometimes be, for example, a bottom electrode or bit line. Row lines 104 and column lines 106 may serve as electrodes that deliver voltage and current to the memory cells 108. Example materials for row lines 104 and column lines 106 may include conducting materials such as Pt, Ta, Hf, Zr, Al, Co, Ni, Fe, Nb, Mo, W, Cu, Ti, TiN, TaN, $Ta_2N$, $WN_2$, NbN, MoN, $TiSi_2$, TiSi, $TiSi_3$, $TaSi_2$, $WSi_2$, $NbSi_2$, $V_3Si$, electrically doped polycrystalline Si, electrically doped polycrystalline Ge, and combinations thereof. In the example of FIG. 1, crossbar array 102 may have N row lines and M column lines.

Memory cells 108 may be coupled between row lines 104 and column lines 106 at intersections of the row lines 104 and column lines 106. For example, memory cells 108 may be positioned to calculate a new node values of an input vector of node values with respect to a weight matrix. Each memory cell 108 may have a memory device such as a resistive memory element, a capacitive memory element, or some other form of memory.

In some examples, each memory cell 108 may include a resistive memory element. A resistive memory element may have a resistance that changes with an applied voltage or current. Furthermore, in some examples, the resistive memory element may "memorize" its last resistance. In this manner, each resistive memory element may be set to at least two states. In many examples, a resistive memory element may be set to multiple resistance states, which may facilitate various analog operations. The resistive memory element may accomplish these properties by having a memristor, which may be a two-terminal electrical component that provides memristive properties as described herein.

In some examples, a memristor may be nitride-based, meaning that at least a portion of the memristor is formed from a nitride-containing composition. A memristor may also be oxide-based, meaning that at least a portion of the memristor is formed from an oxide-containing material. Furthermore, a memristor may be oxy-nitride based, meaning that at least a portion of the memristor is formed from an oxide-containing material and that at least a portion of the memristor is formed from a nitride-containing material. Example materials of memristors may include tantalum oxide, hafnium oxide, titanium oxide, yttrium oxide, niobium oxide, zirconium oxide, or other like oxides, or non-transition metal oxides, such as aluminum oxide, calcium oxide, magnesium oxide, dysprosium oxide, lanthanum oxide, silicon dioxide, or other like oxides. Further examples include nitrides, such as aluminum nitride, gallium nitride, tantalum nitride, silicon nitride, and oxynitrides such as silicon oxynitride. In addition, other functioning memristors may be employed in the practice of the teachings herein.

A memristor may exhibit nonlinear or linear current-voltage behavior. Nonlinear may describe a function that grows differently than a linear function. In some implementations, a memristor may be linear or nonlinear in voltage ranges of interest. A voltage range of interest may be, for example, a range of voltages used in the operation of hardware accelerator 100.

In some examples, memory cell 108 may include other components, such as access transistors or selectors. For example, each memory cell 108 may be coupled to an access transistor between the intersections of a row line 104 and a column line 106. Access transistors may facilitate the targeting of individual or groups of memory cells 108 for the purposes of reading or writing the memory cells.

Alternatively, a selector may be an electrical device that may be used in memristor devices to provide desirable electrical properties. For example, a selector may be a 2-terminal device or circuit element that admits a current that depends on the voltage applied across the terminals. A selector may be coupled to each memory cell 108 to facilitate the targeting of individual or groups of memory cells 108. For example, a selector may do so by acting like an on-off switch, and it may mitigate sneak current disturbance.

The memory cells 108 of crossbar array 102 may be programmed according to a weight matrix of a neural network. A weight matrix may represent a compilation of operations of a neural network. For example, a weight matrix may represent the weighted edges of neural network 500 of FIG. 5. The value stored in the memory cells 108 may represent the values of a weight matrix. In implementations of resistive memory, the resistance levels of each memory cell 108 may represent a value of the weight matrix. In such a manner, the weight matrix may be mapped onto crossbar array 102.

Memory cells 108 may be programmed, for example, by having programming signals driven through them, which drives a change in the state of the memory cells 108. The programming signals may define a number of values to be applied to the memory cells. As described herein, the values of memory cells 108 of crossbar array 102 may represent a weight matrix of a neural network.

Continuing to refer to FIG. 1, hardware accelerator 100 may receive an input vector of node values at the plurality of row lines 104. The input vector may include node values which are to be evolved into next input values for the neural network. The input vector node values may be converted to input voltages 110 by a drive circuit. A drive circuit may deliver a set of input voltages that represents the input vector to the crossbar arrays. In some examples, the voltages 110 may be other forms of electrical stimulus such as an electrical current driven to the memory cells 108. Furthermore, in some examples, the input vector may include digital values, which may be converted to analog values of the input electrical signals by a digital-to-analog converter. In other examples, the input vector may already include analog values.

Upon passing through the crossbar array 102, the plurality of column lines 106 may deliver output currents 114, where the output currents 114 may be compared to a threshold current according to an update rule to generate a new input vector of new node values. Details of these operations is described in further nuance below.

Hardware accelerator 100 may also include other peripheral circuitry associated with crossbar array 102. For example, an address decoder may be used to select a row line 104 and activate a drive circuit corresponding to the selected row line 104. The drive circuit for a selected row line 104 can drive a corresponding row line 104 with different voltages corresponding to a neural network or the process of setting resistance values within memory cells 108 of crossbar array 102. Similar drive and decode circuitry may be included for column lines 106. Control circuitry may also be used to control application of voltages at the inputs and reading of voltages at the outputs of hardware accelerator 100. Digital to analog circuitry and analog to digital circuitry may be used for input voltages 110 and the output currents. In some examples, the peripheral circuitry above described can be fabricated using semiconductor processing techniques in the same integrated structure or semiconductor die as crossbar array.

As described herein, there are three main operations that occur during operation of the hardware accelerator 100. The first operation is to program the memory cells 108 in the crossbar array 102 so as to map the mathematic values in an N×M weight matrix to the array. In some examples, N and M may be the same number, and the weight matrix is symmetrical. In some examples, one memory cell 108 is programmed at a time during the programming operation. The second operation is to calculate an output current by the dot-product of input voltage and the resistance values of the memory cells of a column line 106. In this operation, input voltages are applied and output currents obtained, corresponding to the result of multiplying an N×M matrix by an N×1 vector. In some examples, the input voltages are below the programming voltages so the resistance values of the memory cells 108, such as resistive memory, are not changed during the linear transformation calculation. The third operation is to compare the output currents with a threshold current. For example, current comparators 116 may compare the output currents with the threshold current to determine a new input vector of new node values.

In an example, hardware accelerator 100 may calculate node values by applying a set of voltages $V^I$ 110 simultaneously along row lines 104 of the N×M crossbar array 102 and collecting the currents through column lines 106 and generating new node values 114. On each column line 106, every input voltage 110 is weighted by the corresponding memristance ($1/G_{ij}$) and the weighted summation is reflected at the output current. Using Ohm's law, the relation between the input voltages 110 and the output currents can be represented by a vector-matrix multiplication of the form: $\{V^O\}^T = -\{V^I\}^T [G] R_S$, where $G_{ij}$ is an N×M matrix determined by the conductance (inverse of resistance) of crossbar array 102, Rs is the resistance value of the sense amplifiers and T denotes the transpose of the column vectors $V^O$ and $V^I$. The negative sign follows from use of a negative feedback operational amplifier in the sense amplifiers. From the foregoing, it follows that the hardware accelerator 100 can be utilized for multiplying a first vector of values $\{b_i\}^T$ by a matrix of values $[a_{ij}]$ to obtain a second vector of values $\{c_j\}^T$, where i=1,N and j=1,M. The vector operation can be set forth in more detail as follows.

$$a_{11}b_1 + a_{21}b_2 + \ldots + a_{N1}b_N = c_1$$

$$\ldots$$

$$a_{1M}b_1 + a_{2M}b_2 + \ldots + a_{NM}b_N = c_M.$$

The vector processing or multiplication using the principles described herein generally starts by mapping a matrix of values $[a_{ij}]$ onto crossbar array 102 or, stated otherwise, programming—e.g., writing—conductance values $G_{ij}$ into the crossbar junctions of the crossbar array 102.

With reference still to FIG. 1, in some examples, each of the conductance values $G_{ij}$ may be set by sequentially imposing a voltage drop over each of the memory cells 108. For example, the conductance value $G_{2,3}$ may be set by applying a voltage equal to $V_{Row2}$ at the $2^{nd}$ row line 104 of crossbar array 102 and a voltage equal to $V_{Col3}$ at the $3^{rd}$ column line 106 of the array. The voltage input, $V_{Row2}$, may be applied to the $2^{nd}$ row line at a location 130 occurring at the $2^{nd}$ row line adjacent the j=1 column line. The voltage input, $V_{Col3}$, will be applied to the $3^{rd}$ column line adjacent either the i=1 or i=N location. Note that when applying a voltage at a column line 106, the sense circuitry for that column line may be switched out and a voltage driver switched in. The voltage difference $V_{Row2} - V_{Col3}$ will generally determine the resulting conductance value $G_{2,3}$ based on the characteristics of the memory cell 108 located at the intersection. When following this approach, the unselected column lines 106 and row lines 104 may be addressed according to one of several schemes, including, for example, floating all unselected column lines 106 and row lines 104 or grounding all unselected column lines and row lines. Other schemes involve grounding column lines 106 or grounding partial column lines 106. Grounding all unselected column lines and row lines is beneficial in that the scheme helps to isolate the unselected column lines and row lines to minimize the sneak path currents to the selected column line 106.

In accordance examples herein, memristors used in memory cells 108 may have linear current-voltage relation. Linear current-voltage relations permit higher accuracy in the matrix multiplication process. However, crossbar arrays 102 having linear memristors are prone to having large sneak path currents during programming of the array 102, particularly when the size of crossbar array 102 is larger than a certain size, for instance, 32×32. In such cases, the current running through a selected memristor may not be sufficient to program the memristor because most of the current runs through the sneak paths. Alternatively, the memristor may be programmed at an inaccurate value because of the sneak paths.

To alleviate the sneak path currents in such instances, and especially when larger arrays are desired, an access device, such as an access transistor or a non-linear selector, may be incorporated within or utilized together with a memristor to minimize the sneak path currents in the array. More specifically, memory cell should be broadly interpreted to include memristive devices including, for example, a resistive memory element, a memristor, a memristor and transistor, or a memristor and other components.

Following programming, operation of linear transformation accelerator 100 proceeds by applying the input voltages 110 and comparing the output currents to threshold currents. The output current delivered from column lines 106 may be compared, by current comparator 116, with a threshold current. Current comparator 116 may be a circuit or device that compares two currents (i.e., output current and threshold current) and outputs a digital signal indicating which is larger. Current comparator 116 may have two analog input terminals and one binary digital output.

By comparing the output current with the threshold current, each current comparator may determine a new node value 114 for the neural network. The new node values 114 may be aggregated to generate a new input vector. For example, each output current may be compared with the threshold current by an update rule. For example, a new node value corresponding to a particular output current is set to a first value if the particular output current is greater than or equal to the threshold current, $\theta_i$. The new node value is set to a second value if the particular output current is less than the threshold current $\theta_i$. Each output current may be represented as the sum of the products of an input vector with the weight matrix. For example, the update rule may be represented as the equation that follows.

$$s_i = \begin{cases} +1 & \text{if } \Sigma_j w_{ij} s_j \geq \theta_i \\ -1 & \text{otherwise} \end{cases}$$

The node values may also be programmed to attain values of +1 or 0, rather than +1 and −1 in the above equation. Any other pair of values may also be used. In some examples, the threshold currents may be delivered to the current comparators 116 via circuitry independent from crossbar array 102. Furthermore, in some examples, column lines 106 may have different threshold currents associated with it. This is further described below. Alternatively, each column line 106 may be associated with a same threshold current.

Hardware accelerator 100 may be implemented as an engine in a computing device. Example computing devices that include an example accelerator may be, for example, a personal computer, a cloud server, a local area network server, a web server, a mainframe, a mobile computing device, a notebook or desktop computer, a smart TV, a point-of-sale device, a wearable device, any other suitable electronic device, or a combination of devices, such as ones connected by a cloud or internet network, that perform the functions described herein.

Figure 2:
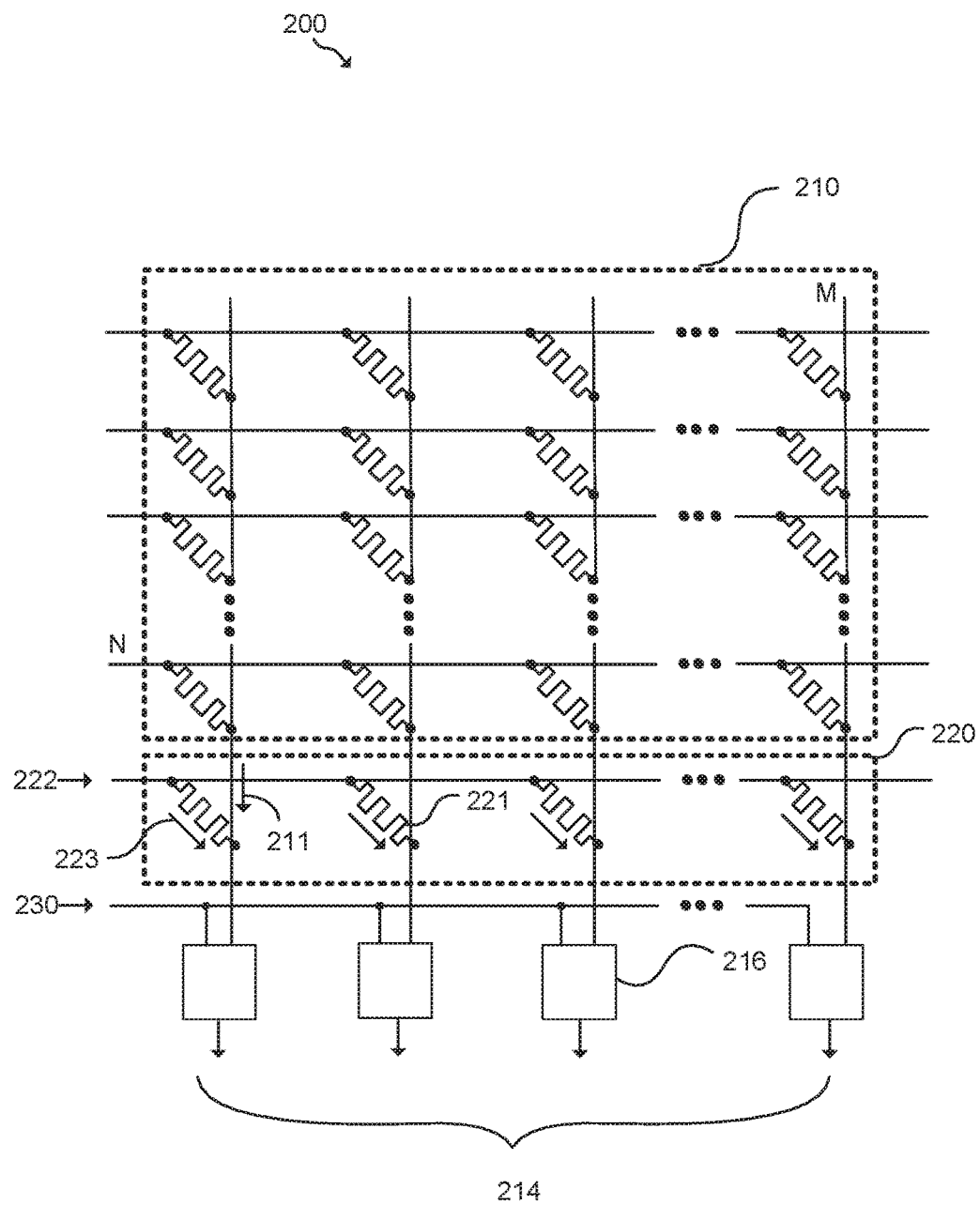
FIG. 2 is a diagram of a second example hardware accelerator for calculating node values of neural networks.

FIG. 2 is a diagram of a second example hardware accelerator 200 for calculating node values of neural networks. Similar to hardware accelerator 100 of FIG. 1, linear transformation accelerator 200 may be a hardware unit that calculates node values of neural networks. Hardware accelerator 200 may calculate node values of a neural network in relation to a weight matrix representing the weighted edges of the neural network. Hardware accelerator 200 may do so by calculating a dot-product of the input vector with the weight matrix, and comparing the output currents of each column with a threshold current.

Hardware accelerator 200 may have a crossbar array 210, which may be analogous to crossbar array 102 of FIG. 1. In addition, crossbar array 210 may have a threshold row line 220, which may be additional to the N×M structure used to map a weight matrix. The memory cells coupled to the threshold line 220 may be programmed according to a threshold current for a corresponding column line. In other words, the memory cells of the threshold line 220 may be tuned to unique conductance values which effectively allows each output current to be compared to different threshold currents.

For example, the threshold line 220 may receive a threshold voltage 222. The threshold voltage may then pass each memory cell 221 of the threshold line 220 to produce an output-modification current 223 for each column line. The output-modification current 223 may be summed with the output current 211 of the N×M portion of the crossbar array 210, which is a dot-product current of the input vector and the weight matrix, to produce the output current.

The output current may then be compared with a threshold current for each column line to calculate new node values. In some examples, a current comparator 216 may be coupled to each column line of crossbar array 210. Because the threshold line 220 has uniquely modified the output current of each column line, a same current comparator 216 may be used at each column line and a same current for comparison 230 may be delivered to each current comparator 216. Based on the update rule, hardware accelerator 200 may generate a new input vector 214 of new node values.

Figure 3:
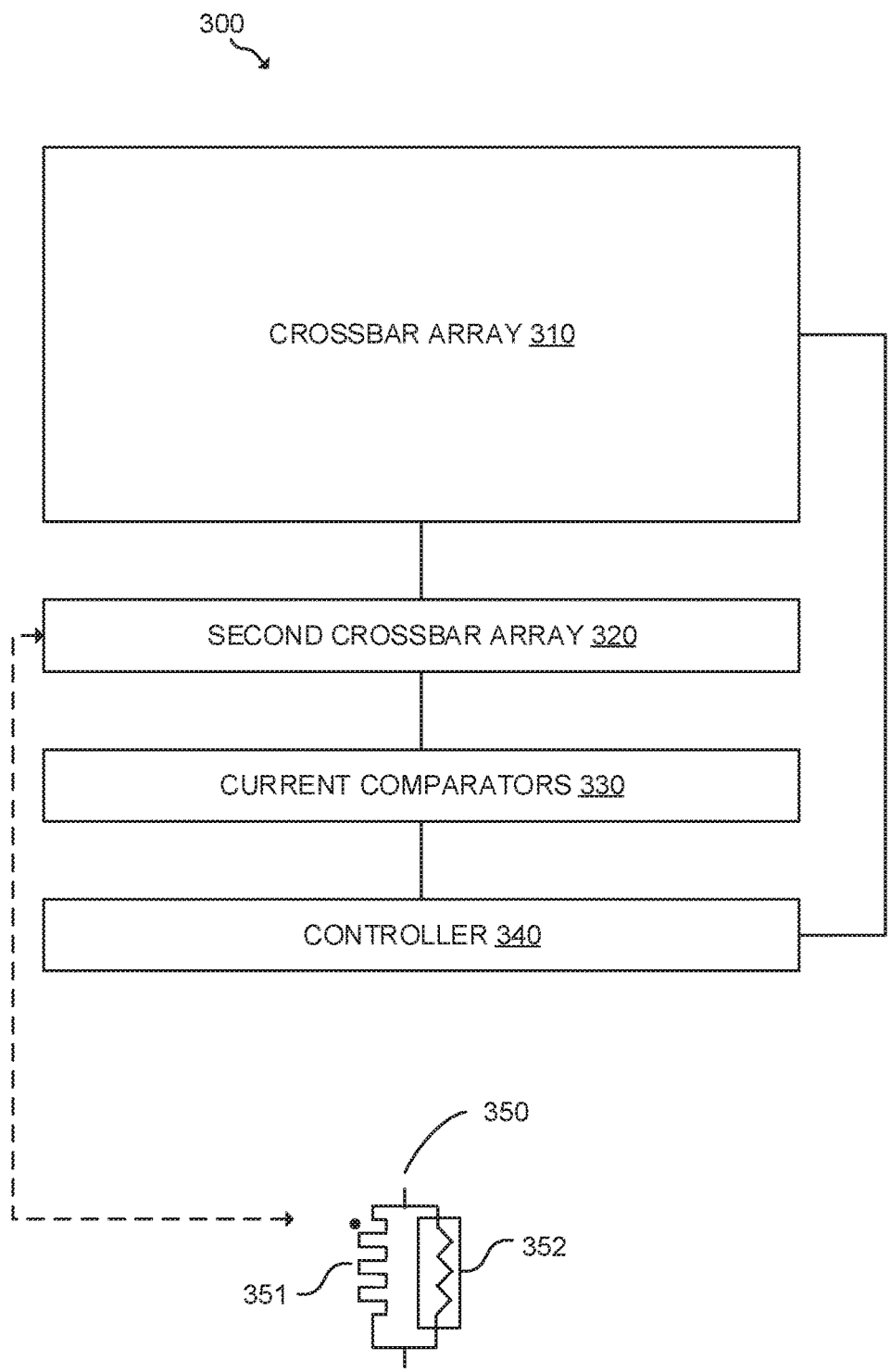
FIG. 3 is a conceptual diagram of a third example hardware accelerator for calculating node values of neural networks.

FIG. 3 conceptually illustrates a third example hardware accelerator 300 for calculating node values of neural networks. Similar to hardware accelerators 100 and 200 of FIG. 1 and FIG. 2 respectively, linear transformation accelerator 300 may be a hardware unit that calculates node values of neural networks. Hardware accelerator 300 may calculate node values of a neural network in relation to a weight matrix representing the weighted edges of the neural network. Hardware accelerator 300 may do so by calculating a dot-product of the input vector with the weight matrix, and comparing the output currents of each column with a threshold current.

Hardware accelerator 300 may have a crossbar array 310, which may be analogous to crossbar array 102 of FIG. 1. Second crossbar array 320 may include a threshold row line, a plurality of column lines having the same number of column lines as the crossbar array 310, and a threshold device coupled between the threshold line and each column line. Second crossbar array 320 may be operably coupled to crossbar array 310 by coupling each column line of the second crossbar array 320 with a corresponding column line of the crossbar array 310.

The threshold devices of second crossbar array 320 may be tuned according to a threshold current for each column line of the crossbar array 310. As described with reference to FIG. 2, column lines may be associated with different threshold currents. Accordingly, the threshold devices of second crossbar array 320 may modify the output current from crossbar array 310 to produce an output current reflective of a unique threshold current for the corresponding column line.

An example threshold device 350 is illustrated to be a two-terminal electrical device. Threshold device 350 may include a number of components, including memristors and selectors. In the example illustrated, threshold device 350 may include a memristor in parallel with a selector. As an illustration, current from a column may flow either through the memristor or the selector of threshold device 350. The memristor value may be tuned to match a desired threshold function for the column. A large threshold may be reflected in a high conductance state of the memristor, which sinks a large part of current from the column. The selector may enter a state of very low resistance if the current from the column minus the current flowed through the parallel memristor is high enough to trigger an insulator-conductor transition of the selector. In such instances, a high current may be delivered out of the threshold device 350.

In some implementations, a selector may exhibit negative differential resistance (NDR), which causes nonlinearity. Negative differential resistance is a property in which an increase in applied current may cause a decrease in voltage across the terminals, in certain current ranges. In some examples, negative differential resistance may be a result of heating effects on certain selectors. In some examples, NDR effect may contribute to the nonlinearity of selectors. Other examples of selectors include volatile conducting bridge and other types of devices.

After being modified by the second crossbar array 320, output currents may be compared by current comparators 330 to threshold currents. As described above, doing so may produce a new input vector of new node values.

Upon delivery of the new input vector of new node values, a controller 340 may determine whether the new node values are final node values of the neural network. For example, a neural network may be modeled to determine a minimum energy of a system. In such an example, controller 340 may determine whether the new node values, which here represents an energy of the system, are a local minimum of the system.

In response to the controller 340 determining that the new node values are not final node values, controller 340 may convert the new input vector to input voltages to be delivered to the plurality of row lines of the crossbar array 310. In such a manner, the neural network may be recurrent to calculate an iterative problem, such as determining a minimum energy of a system.

Figure 4:
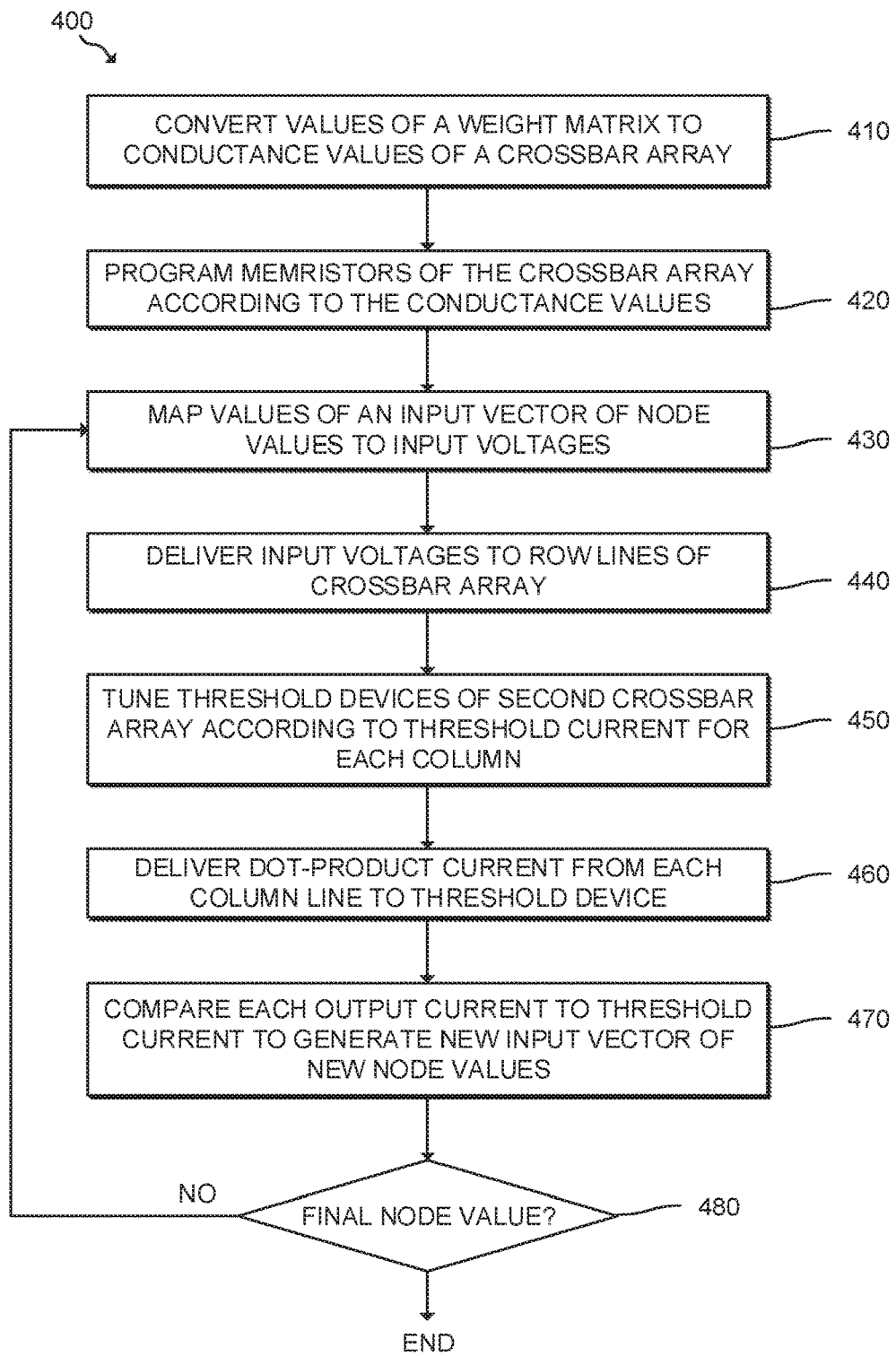
FIG. 4 is a flowchart of an example method for calculating a node values of a neural networking using example hardware accelerators.

FIG. 4 depicts a flowchart of an example method 400 for calculating a node values for a neural networking using a hardware accelerator. Although execution of method 400 is herein described in reference to linear transformation accelerators 100 and 300 of FIG. 1 and FIG. 3 respectively, other suitable examples of method 400 should be apparent, including the examples provided in FIG. 2.

In an operation 410, a weight matrix may be converted to conductance values of crossbar array 102 of FIG. 1 or crossbar array 310 of FIG. 3. The weight matrix may represent any neural network operation. The value stored in the memory cells 108 of crossbar array 102 may represent the values of the weight matrix. In implementations of resistive memory, the resistance levels of each memory cell 102 may represent a value of the weight matrix. In such a manner, the weight matrix may be mapped onto crossbar array 102.

In an operation 420, the memory cells 108 of the crossbar array 102 may be programmed according to the conductance values converted in operation 410. As described previously, memory cells 108 may be programmed, for example, by having programming signals driven through them, which drives a change in the state of the memory cells 108.

In an operation 430, values of an input vector may be mapped to input voltages 110. For examples, numerical values of an input vector may be mapped into a plurality of voltage values to be delivered to the crossbar array. For example, the input voltage 110 may be voltage values that drives a current to each memory cell 108 of crossbar array 102.

In an operation 440, the input voltages 110 are delivered to row lines 104 of crossbar array 102 to deliver a dot-product current from each column line 106.

In an operation 450, the threshold devices 350 of second crossbar array 320 may be tuned according to a threshold current for each column line. In an operation 460, the dot-product current from each column line of crossbar array 102 or crossbar array 310 is delivered to each threshold device 350. Accordingly, the threshold devices of second crossbar array 320 may modify the dot-product current from crossbar array 102 or crossbar array 310 to produce an output current reflective of a unique threshold current for the corresponding column line.

In an operation 470, current comparator 116 or 330 may compare each output current to a threshold current according to an update rule. Comparing whether an output current is equal to or greater than a threshold current allows the determination of a new binary node value. The new node values from each column line form the new input vector of new node values.

In an operation 480, controller 340 may determine whether the new node values are final node values of the neural network. In response to the controller 340 determining that the new node values are not final node values, method 400 may return to operation 430, where the new input vector is mapped to input voltages to be delivered to the crossbar array. Furthermore, in some examples, controller 340, in operation 480, may halt the method after a predetermined number of node value vectors have been calculated. Alternatively, or in addition, controller 340 in operation 480 may halt the method after determining a predetermined number of nodes values have attained stable (i.e., unchanging) values.

FIG. 5 is a conceptual model of an example neural network. FIG. 5 was described previously herein with reference to FIG. 1.

The foregoing describes a number of examples for hardware accelerators for calculating node values of neural networks and their applications. It should be understood that the examples described herein may include additional components and that some of the components described herein may be removed or modified without departing from the scope of the examples or their applications. It should also be understood that the components depicted in the figures are not drawn to scale, and thus, the components may have different relative sizes with respect to each other than as shown in the figures.

Further, the sequence of operations described in connection with FIGS. 1-5 are examples and are not intended to be limiting. Additional or fewer operations or combinations of operations may be used or may vary without departing from the scope of the disclosed examples. Furthermore, implementations consistent with the disclosed examples need not perform the sequence of operations in any particular order. Thus, the present disclosure merely sets forth possible examples of implementations, and many variations and modifications may be made to the described examples. All such modifications and variations are intended to be included within the scope of this disclosure and protected by the following claims.

It should further be noted that, as used in this application and the appended claims, the singular forms "a," "an," and "the" include plural elements unless the context clearly dictates otherwise.

What is claimed is:

1. A hardware accelerator, comprising:
   a crossbar array programmed to calculate node values of a neural network, the crossbar array comprising a plurality of row lines, a plurality of column lines, and a memory cell coupled between each unique combination of one row line and one column line, wherein:
   the memory cells are programmed according to a weight matrix;
   each row line of the plurality of row lines is to receive an input voltage according to an input vector of node values; and
   each column line of the plurality of column lines is to deliver an output current representing a dot-product current of the input vector and a column line;
   the hardware accelerator further comprising a second crossbar array, the second crossbar array comprising a threshold row line, a second plurality of column lines having the same number of column lines as the crossbar array, and a threshold device coupled between the threshold row line and each column line, wherein:
the threshold devices are tuned according to a threshold current to modify the output current of each column line of the crossbar array; and
the second crossbar array is operably coupled between the crossbar array and the current comparators by coupling each column line of the second crossbar array between a corresponding column line of the crossbar array and a corresponding current comparator to compare each modified output current to a threshold current according to an update rule to generate a new input vector of new node values.

2. The hardware accelerator of claim 1, wherein:
a new node value corresponding to a particular output current is set to a first value if the particular output current is greater than or equal to the threshold current; and
the new node value corresponding to the particular output current is set to a second value if the particular output current is less than the threshold current.

3. The hardware accelerator of claim 1, comprising a controller to:
determine whether the new node values are final node values of the neural network; and
in response to the controller determining the new node values are not final node values, map the new input vector to input voltages to be delivered to the plurality of row lines of the crossbar array.

4. The hardware accelerator of claim 1, wherein:
the threshold devices coupled to the threshold row line are programmed according to a threshold current for a corresponding column line;
the threshold row line is to receive a threshold voltage, wherein the threshold voltage is to produce an output-modification current for each column line; and
the dot-product current is to be summed with the output-modification current to produce the output current.

5. The hardware accelerator of claim 4, wherein a threshold current for a first column is different than a threshold current for a second column.

6. The hardware accelerator of claim 4, wherein a current comparator is coupled to an end of each column line of the crossbar array, wherein each current comparator comprises a sum circuit.

7. A hardware accelerator for implementing a recurrent neural network, comprising:
a crossbar array programmed to calculate node values of a neural network, the crossbar array comprising a plurality of row lines, a threshold row line, a plurality of column lines, a memory cell coupled between each unique combination of one row line and one column line, and a threshold device coupled between each unique combination of the threshold row line and one column line, wherein:
the memory cells line are programmed according to a weight matrix;
the threshold devices coupled to the threshold row line are programmed according to a threshold current for a corresponding column line;
each row line of the plurality of row lines is to receive an input voltage according to an input vector of node values;
the threshold row line is to receive a threshold voltage, wherein the threshold voltage is to produce from the threshold devices an output-modification current for each column line; and
each column line of the plurality of column lines is to deliver an output current representing a summation of a corresponding output-modification current and a dot-product current of the input vector and a corresponding column line; and
a current comparator to compare each output current to a threshold current according to an update rule to generate a new input vector of new node values.

8. The hardware accelerator of claim 7, wherein a threshold current for a first column is different than a threshold current for a second column.

9. The hardware accelerator of claim 7, wherein:
a new node value corresponding to a particular output current is set to a first value if the particular output current is greater than or equal to the threshold current; and
the new node value corresponding to the particular output current is set to a second value if the particular output current is less than the threshold current.

10. The hardware accelerator of claim 7, comprising a controller to:
determine whether the new node values are final node values of the neural network; and
in response to the controller determining the new node values are not final node values, convert the new input vector to input voltages to be delivered to the plurality of row lines of the crossbar array.

11. A method, comprising:
converting values of a weight matrix of a neural network to conductance values of a crossbar array, the crossbar array comprising a plurality of row lines, a plurality of column lines, and a memristor coupled between each unique combination of one row line and one column line; and
programming the memristors of the crossbar array according to the conductance values;
mapping values of an input vector of node values of the neural network to input voltages;
delivering the input voltages to the plurality of row lines;
delivering an output current from each column line of the plurality of column lines to a corresponding threshold device to modify the output current; and
comparing, with a current comparator, each modified output current to a threshold current according to an update rule to generate a new input vector of new node values, wherein:
a new node value corresponding to a particular output current is set to a first value if the particular output current is greater than or equal to the threshold current; and
the new node value corresponding to the particular output current is set to a second value if the particular output current is less than the threshold current.

12. The method of claim 11, further comprising:
determining whether the new node values are final node values of the neural network; and
in response to the controller determining the new node values are not final node values, converting the new input vector to input voltages to be delivered to the plurality of row lines of the crossbar array.

13. The method of claim 11, further comprising tuning the threshold devices according to a threshold current for each column line of the crossbar array, wherein the threshold devices are coupled between a threshold line and each column line of a second crossbar array, wherein second crossbar array is operably coupled between the crossbar array and the current comparator by coupling each column line of the second crossbar array between a corresponding column line of the crossbar array and a corresponding current comparator.

* * * * *